(12) United States Patent
Yu et al.

(10) Patent No.: US 12,424,987 B2
(45) Date of Patent: Sep. 23, 2025

(54) AMPLIFIER CIRCUIT

(71) Applicant: REALTEK SEMICONDUCTOR CORP., Hsinchu (TW)

(72) Inventors: Chia-Wei Yu, Hsinchu (TW); Yung-Tai Chen, Hsinchu (TW); Tsung-En Wu, Hsinchu (TW); Cheng-Hsien Li, Hsinchu (TW); Sheng-Yang Ho, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 476 days.

(21) Appl. No.: 18/081,014

(22) Filed: Dec. 14, 2022

(65) Prior Publication Data

US 2023/0188102 A1 Jun. 15, 2023

(30) Foreign Application Priority Data

Dec. 15, 2021 (TW) .................................. 110146860

(51) Int. Cl.
H03F 3/45 (2006.01)
H03F 3/195 (2006.01)
H03G 3/30 (2006.01)

(52) U.S. Cl.
CPC ......... *H03F 3/195* (2013.01); *H03F 3/45475* (2013.01); *H03G 3/3036* (2013.01)

(58) Field of Classification Search
CPC ....................................................... H03F 3/45
USPC .................................................. 330/254, 260
See application file for complete search history.

(56) References Cited

FOREIGN PATENT DOCUMENTS

TW     I699969 B     7/2020

*Primary Examiner* — Henry Choe
(74) *Attorney, Agent, or Firm* — Li & Cai Intellectual Property (USA) Office

(57) ABSTRACT

An amplifier circuit includes a continuous-time linear equalizer, an adjustable gain circuit and a filter circuit. The continuous-time linear equalizer includes a first high-pass path, a first low-pass path, a second high-pass path, and a second low-pass path. The first high-pass path is used to increase a gain of a high-frequency part of a first signal source, and the second high-pass path is used to increase a gain of a high-frequency part of a second signal source. The filter circuit is used to amplify and filter the first signal source and the second signal source, and includes a fully-differential operational amplifier, a first filter network, and a second filter network.

11 Claims, 4 Drawing Sheets

AMPLIFIER CIRCUIT

CROSS-REFERENCE TO RELATED PATENT APPLICATION

This application claims the benefit of priority to Taiwan Patent Application No. 110146860, filed on Dec. 15, 2021. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an amplifier circuit, and more particularly to an amplifier circuit that can be applied to a long-distance broadband network communication system, so as to compensate for an attenuation of high-frequency signals.

BACKGROUND OF THE DISCLOSURE

Referring to FIG. 1, which is a schematic diagram showing an attenuation of a high-frequency signal using the existing amplifier. In a communication system, the longer the communication distance, the faster the high-frequency signal attenuates. If the amplifier circuit that is commonly seen in relevant literature is utilized as shown in FIG. 1, since the high-frequency signal is attenuated, the noise of the high-frequency signal is relatively small, and the connection quality of the overall communication system is poor.

In addition, in the existing communication system, the receiver amplifier is a widely used circuit for amplifying electronic signals or performing various operations on the signals. However, the existing first-order filter circuit is unable to amplify high-frequency signals. If the connection distance required for establishing the communication system is long, it will cause attenuation of high-frequency signals and degrade a noise ratio of the high-frequency signals, resulting in poor connection quality in response to the communication system performing a long-distance communication.

SUMMARY OF THE DISCLOSURE

In response to the above-referenced technical inadequacies, the present disclosure provides an amplifier circuit that can be applied to a long-distance broadband network communication system, so as to compensate for an attenuation of high-frequency signals.

In one aspect, the present disclosure provides an integrated circuit, which includes an equalizer circuit, an adjustable gain circuit, and a filter circuit.

In some embodiments, the continuous-time linear equalizer includes a first high-pass path, a first low-pass path, a second high-pass path, and a second low-pass path. The first high-pass path is electrically coupled between a first signal input terminal and a first node, and includes a first resistive circuit and a first capacitive circuit that are configured to amplify a gain of a high frequency part of a first input signal provided by a first signal source to the first signal input terminal. The first low-pass path is electrically coupled between the first signal input terminal and a second node, and includes a second resistive circuit. The second low-pass path is electrically coupled between a second signal input terminal and a third node, and includes a third resistive circuit. The second high-pass path is electrically coupled between the second signal input terminal and a fourth node, and includes a fourth resistive circuit and a second capacitive circuit that are configured to amplify a gain of a high frequency part of a second input signal provided by a first signal source to the second signal input terminal.

In some embodiments, the adjustable gain circuit includes a first variable resistive circuit, a second variable resistive circuit, and a third variable resistive circuit. The first variable resistive circuit is electrically coupled between the second node and the third node, the second variable resistive circuit is electrically coupled between the first node and the second node, and the third variable resistive circuit is electrically coupled between the third node and the fourth node.

In some embodiments, the filter circuit is configured to amplify and filter the first signal source and the second signal source, and includes a fully differential operational amplifier, a first filter network, and a second filter network. The fully differential operational amplifier has a first input terminal, a second input terminal, a first output terminal and a second output terminal. The first filter network is electrically coupled to the first input terminal, the first output terminal and the first node. The second filter network is electrically coupled to the second input terminal, the second output terminal and the fourth node.

Therefore, the amplifier circuit provided by the present disclosure can be applied to a long-distance broadband network communication system to compensate for the attenuation of high-frequency signals, and reduce the attenuation caused by a long connection distance, while improving the connection quality of the long-distance broadband communication.

In particular, the amplifier circuit provided by the present disclosure can amplify attenuated high-frequency signals to achieve better connection quality, and only a single operational amplifier is used in the amplifier circuit to achieve functions of gain adjustment, second-order filtering, echo cancellation and high-frequency signal amplification. Furthermore, since a capacitive circuit with a smaller area is used to amplify high-frequency signals, an area used by the circuit can be saved and the cost can be reduced.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
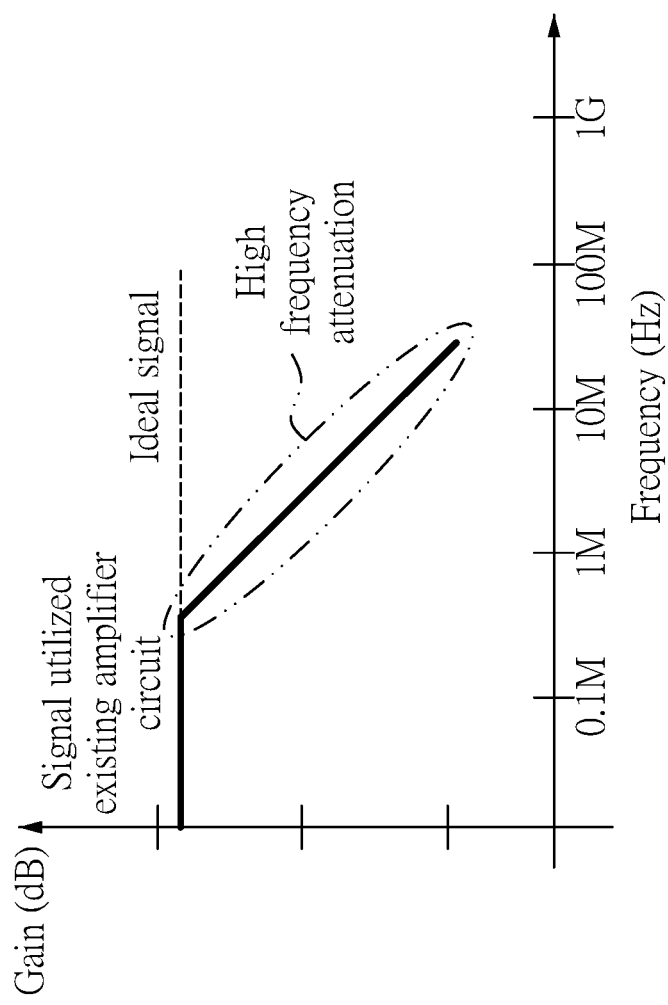
FIG. 1 is a schematic diagram of high frequency signal attenuation using the existing amplifier circuit.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 2:
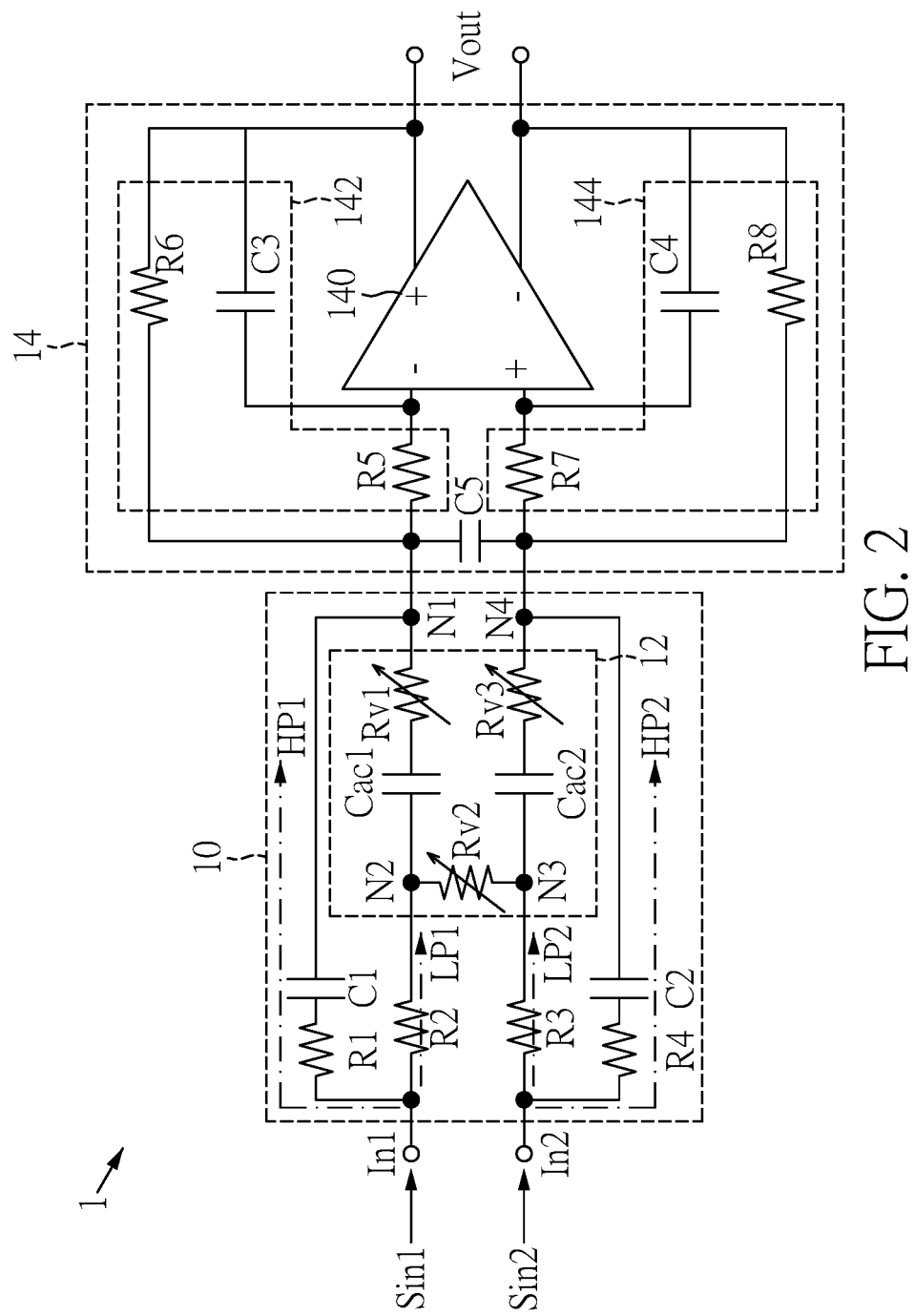
FIG. 2 is a circuit diagram of an amplifier circuit according to one embodiment of the present disclosure.

FIG. 2 is a circuit diagram of an amplifier circuit according to one embodiment of the present disclosure. Referring to FIG. 2, one embodiment of the present disclosure provides an amplifier circuit 1, which includes a continuous-time linear equalizer (CTLE) 10, an adjustable gain circuit 12 and a filter circuit 14. In some applications, the amplifier circuit 1 can be a part of a receiver for amplifying an input signal and transmitting the amplified input signal to an analog-to-digital converter, but the function of the amplifier circuit is not limited in the present disclosure.

As shown in FIG. 2, the CTLE 10 includes a first high-pass path HP1, a first low-pass path LP1, a second high-pass path HP2, and a second low-pass path LP2. The amplifier circuit 1 has a first signal input terminal In1 and a second signal input terminal In2 that are configured to receive a first signal source Sin1 and a second signal source Sin2, respectively. Since the differential signal scheme is utilized, the first signal source Sin1 and the second signal source Sin2 can be a differential pair of signal sources.

The first high-pass path HP1 is connected between the first signal input terminal In1 and a node N1, and includes a resistor R1 and a capacitor C1. The first low-pass path LP is connected between the first signal input terminal In1 and a node N2, and includes a resistor R2.

As a capacitive impedance for the first signal source Sin1 that is in a high frequency state is relatively small, which is equivalent to the impedance being smaller and the gain being for high frequency signals, a high frequency amplification can thereby be achieved. Therefore, since the capacitor C1 and the resistor R1 are provided on the first high-pass path HP1, the first high-pass path HP1 is similar to a small high-pass filter, and can be used to amplify a gain of a high frequency part of a first input signal provided by the first signal source Sin1 to the first signal input terminal In1.

On the other hand, the second high-pass path HP1 is connected between the second signal input terminal In2 and a node N4, and includes a resistor R4 and a capacitor C2. The second low-pass path LP2 is connected between the second signal input terminal In2 and a node N3, and includes a resistor R3. Similarly, since the capacitor C2 and the resistor R4 are provided on the second high-pass path HP2, the second high-pass path HP2 is similar to a small high-pass filter, and can be used to amplify a gain of a high frequency part of a second input signal provided by the second signal source Sin2 to the second signal input terminal In2.

In the embodiment of FIG. 2, the adjustable gain circuit 12 can include variable resistors Rv1, Rv2, and Rv3. The variable resistor Rv1 is connected between the node N2 and the node N3, the variable resistor Rv2 is connected between the node N1 and the node N2, and the variable resistor Rv3 is connected between the node N3 and the node N4. In some embodiments, the variable resistors Rv1, Rv2, and Rv3 are adjustable as indicated by arrows in FIG. 2. For example, the variable resistors Rv1, Rv2, and Rv3 can be adjusted by hardware (for example, fuse, register, and the like) or firmware (for example, software, operating system, and the like).

The adjustable gain circuit 12 can adjust ratios of resistances of the variable resistors Rv1 and Rv2 to modulate current division. The modulated current can be converted into an output voltage Vout through a feedback resistor of the filter circuit 14. In this way, the adjustable gain can be realized.

The variable gain circuit 12 also includes alternating current (AC) coupling capacitors Cac1 and Cac2. The AC coupling capacitor Cac1 is connected between the variable resistor Rv2 and the node N2, and the AC coupling capacitor Cac2 is connected between the variable resistor Rv3 and the node N3. Here, as shown in FIG. 2, the AC coupling capacitors Cac1 and Cac2 and the variable resistors Rv1 and Rv2 can be used to provide a common mode voltage at an input end of the filter circuit 14. AC coupling topology can be utilized to address many issues of adopting direct current (DC) coupling scheme, such as power consumption and crosstalk.

In the above-mentioned embodiment, the overall equivalent impedance RCTLE of the CTLE 10 and the adjustable gain circuit 12 can be expressed by the following equation (1):

$$RCTLE = (R1 + 1/sC1) // (R2 + (0.5 Rv2 // Rv1)) \quad \text{equation (1)};$$

where R1, R2, Rv1, Rv2 represent resistance values of the resistors R1, R2 and the variable resistors Rv1, Rv2, respectively, and s is a complex frequency $\sigma + j\omega$.

In some embodiments, the filter circuit 14 includes a fully-differential operational amplifier 140, a first filter network 142 and a second filter network 144. The fully-differential operational amplifier has a first input terminal (left side "−" terminal), a second input terminal (left side "+" terminal), a first output terminal (right side "+" terminal), and a second output terminal (right side "−" terminal). The first filter network 142 is connected to the first input terminal, the first output terminal and the node N1. The second filter network 144 is connected to the second input terminal, the second output terminal and the node N4.

In this embodiment, the filter circuit 144 is a second-order filter circuit. For example, a second-order active filter circuit such as a Butterworth, Chebyshev, Bessel, or Sallen-Key filter circuit can be used. As shown in FIG. 2, a fully-differential second-order Butterworth low-pass filter with multiple-feedback (MFB) topology is used, but the present disclosure is not limited thereto. The Butterworth filter achieves its flatness at the expense of a relatively wide transition region from the passband to the stopband, and has average transient characteristics.

As shown in FIG. 2, the first filter network 142 includes a capacitor C3 and resistors R5 and R6, and the second filter network 144 includes a capacitor C3 and resistors R5 and R6. The first filter network 142 and the second filter network 144 form a symmetrical structure, the capacitor C3 is connected between the first input terminal and the first output terminal, the resistor R5 is connected between the first input terminal and the node N1, and the resistor R6 is connected between the first output terminal and the node N1. Similarly, the capacitor C4 is connected between the second input terminal and the second output terminal, the resistor R7 is connected between the second input terminal and the node N4, and the resistor R8 is connected between the second output terminal and the node N4. The filter circuit 14 further includes a capacitor C5, which is connected between the node N1 and the node N4.

Furthermore, the filter circuit 144 essentially shares the variable resistors Rv1 and Rv2 with the adjustable gain circuit 12. Therefore, the ratio of the resistances of the variable resistors Rv1 and Rv2 are adjusted to modulate current division. The modulated current can be converted into the output voltage Vout through feedback resistors R6 and R8 to realize the adjustable gain, and two capacitors C3 and C4 are connected in parallel to complete the structure of the filter circuit 144.

Therefore, the amplifier circuit provided by the present disclosure can amplify attenuated high-frequency signals to achieve better connection quality, and only a single operational amplifier is used in the circuit to achieve functions of adjustable gain, second-order filter, and high-frequency signal amplification. Furthermore, since a capacitor with a smaller area is used to amplify high-frequency signals, an area used by the circuit can be saved and the cost can be reduced.

Figure 3:
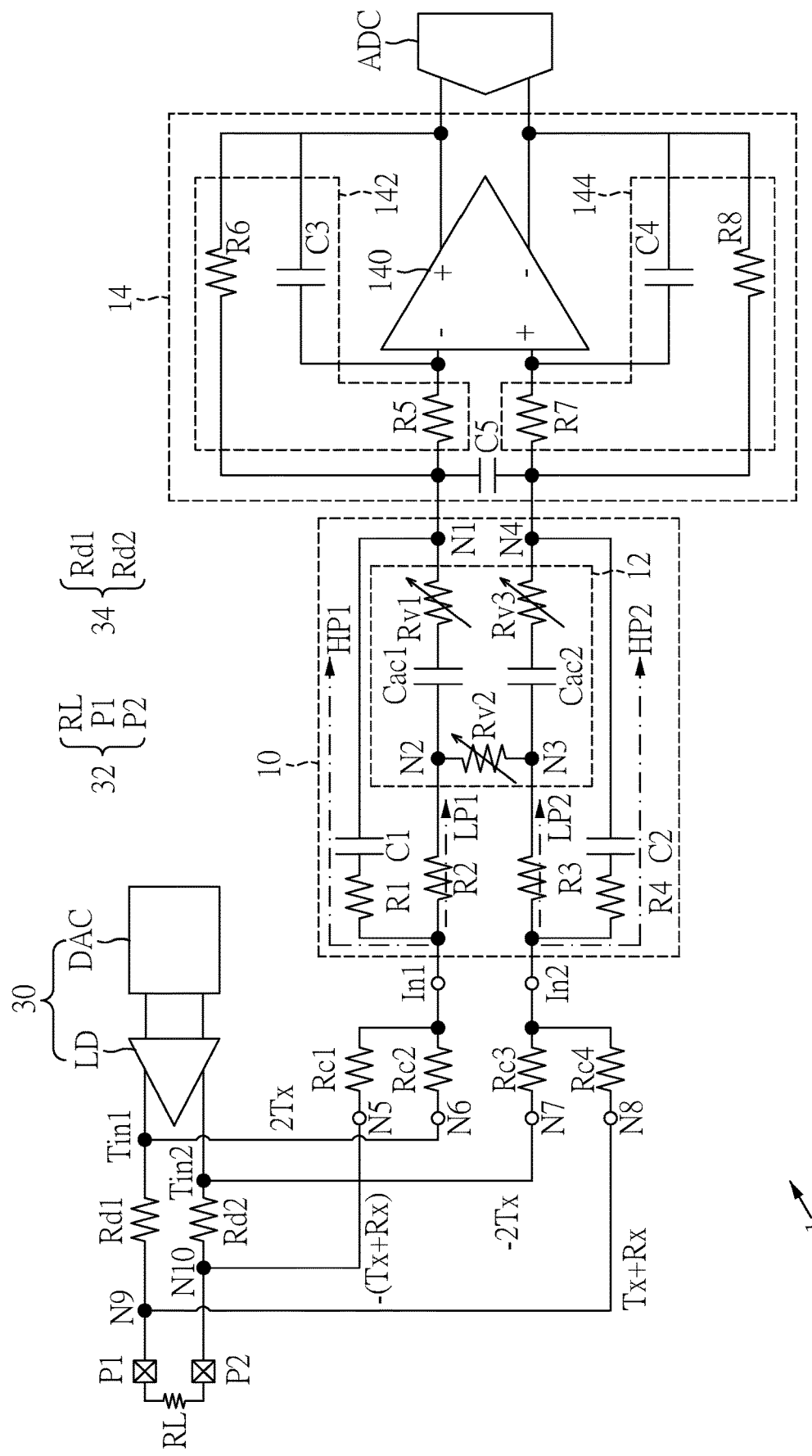
FIG. 3 is a circuit diagram of an amplifier circuit that is applied to a communication system according to another embodiment of the present disclosure.

Reference is made to FIG. 3, FIG. 3 is a circuit diagram of an amplifier circuit that is applied to a communication system according to another embodiment of the present disclosure. The amplifier circuit 1 of FIG. 2 is used in the circuit structure of FIG. 3, so that details thereof are not repeated herein.

In FIG. 3, the amplifier circuit 1 further includes an echo cancellation circuit 18, which includes cancellation resistors Rc1, Rc2, Rc3, and Rc4. The cancellation resistor Rc1 is connected between the node N5 and the first signal input terminal In1, the cancellation resistor Rc2 is connected between the node N6 and the first signal input terminal In1, the cancellation resistor Rc3 is connected between the node N7 and the second signal input terminal In2, and the cancellation resistor Rc4 is connected between the node N8 and the second signal input terminal In2.

In certain specific communication systems, the amplifier circuit 1 is connected to a transmitting end device 30 (including a linear driver LD and a digital-to-analog converter DAC), a receiving end device (such as an analog-to-digital converter ADC), a voltage dividing circuit 32 and a communication interface 34, and the amplifier circuit 1 and the transmitting end device 30 share the communication interface 32.

However, in such a system, when the amplifier circuit 1 needs to capture receiving signals through the communication interface 34, the system will be affected by a transmitting signal Tx simultaneously transmitted on the same channel, so that it is difficult to determine a true appearance of the receiving signals. This phenomenon is generally referred to as echo impairment. In order to minimize effects of the echo impairments, the amplifier circuit 1 of the present disclosure further uses the echo cancellation circuit 18 to remove components of the transmitting signal in the received signals.

As shown in FIG. 3, the transmitting end device 30 has a first transmitting end Tin1 and a second transmitting end Tin2. The communication interface 34 includes a load RL and pads P1 and P2. The voltage dividing circuit 32 has a voltage dividing resistor Rd1 connected to the pad P1 and the transmitting terminal Tin1, and a voltage dividing resistor Rd2 connected to the pad P2 and the second transmitting terminal Tin2. Here, the voltage dividing circuit 32 is used to design multiple voltages input to the echo cancellation circuit 18 under the differential signal architecture, but the present disclosure is not limited thereto.

After the above architecture is combined with the aforementioned echo cancellation circuit 18, the node N8 is connected to a node N9 between the pad P1 and the voltage dividing resistor Rd1, the node N6 is connected to the first transmitting terminal Tin1, the node N7 is connected to the second transmitting terminal Tin2, and the node N5 is connected to a node N10 between the pad P2 and the voltage dividing resistor Rd2.

Therefore, in this architecture, when the transmitting end device 30 provides a first transmitting signal, for example, +2Tx, to the first transmitting end Tin1, and provides a second transmitting signal, for example, −2Tx, to the second transmitting end Tin2, at the same time, the communication interface 32 provides the first receiving signal, for example, +Rx, to the pad P1, and provides the second receiving signal, for example, −Rx, to the pad P2. Here, the amplifier circuit 1, the transmitting end device 30, and the receiving end device are implemented by the differential signal scheme. One voltage signal can include two voltages represented by "+" and "−", and a value of the voltage signal is defined by a difference between the two voltages represented by "+" and "−", respectively.

Therefore, the first transmission signal +2Tx is divided by the voltage dividing resistor Rd1 to superimpose the first receiving signal +Rx at the node N9, so as to generate a first dividing voltage signal, that is, 2Tx*d1+Rx, where d1 is a voltage division ratio of the voltage dividing resistor Rd1, and the second transmission signal −2Tx is divided by the voltage dividing resistor Rd2 to superimpose the second receiving signal −Rx at the node N10, so as to generate a second dividing voltage signal, that is, −2Tx*d2−Rx.

It should be noted that there is a first proportional relationship between resistances of the cancellation resistors Rc1 and Rc2, such that only the second receiving signal −Rx remains after the second dividing voltage signal (−2Tx*d2−Rx) received by the node N5 and the first transmission signal +2Tx received by the node N6 are superimposed at the signal input terminal In1.

Similarly, there is a second proportional relationship between the cancellation resistors Rc3 and Rc4, such that only the first received signal +Rx remains after the second transmitting signal (−2Tx) received by the node N7 and the first dividing voltage signal (2Tx*d1+Rx) received by the node N8 are superimposed at the second signal input terminal In2.

Moreover, since the differential signal scheme is utilized, the first proportional relationship should be the same as the second proportional relationship, and corresponds to a third proportional relationship between resistances of the voltage dividing resistor Rd1 and the load RL.

Therefore, taking this embodiment as an example, the resistance values of the voltage dividing resistors Rd1 and Rd2 in the voltage dividing circuit 34 are set to one-half of an equivalent resistance value of the load RL of the communication interface 32, for example, Rd1, Rd2 are 50 ohms and RL is 100 ohms. According to the voltage divider rule, d1=d2=0.5, the second dividing voltage signal received by the node N5 is −(Tx+Rx), and the first dividing voltage signal received by the node N8 is Tx+Rx.

Then, according to the voltage divider rule, it can be seen that since the second dividing voltage signal received by the node N5 is −(Tx+Rx) and the node N6 receives the first transmission signal 2Tx, when the cancellation resistance Rc2 is twice the resistance value of the cancellation resistance Rc1, only the second receiving signal −Rx remains after the second dividing signal and the first transmitting signal are superimposed at the first signal input terminal In1. Thus, the first proportional relationship can be obtained.

Similarly, under the premise that the first dividing voltage signal received by the node N8 is (Tx+Rx) and the node N7 receives the second transmitting signal 2Tx, when the cancellation resistance Rc3 is twice of the resistance value of the cancellation resistance Rc4, only the first receiving signal +Rx remains after the first dividing signal and the second transmitting signal are superimposed at the second signal input terminal In2. Thus, the second proportional relationship can be obtained, and the first proportional relationship and the second proportional relationship can correspond to the third proportional relationship. In addition, the resistance value of the cancellation resistor Rc2 can be set equal to the input impedance (hereinafter referred to as Rin), and the resistance value of the cancellation resistor Rc1 is equal to half of the input impedance (Rin/2), and Rin is equal to an equivalent impedance of the transmitting end device 30 (hereinafter referred to as RTX), so as to achieve impedance matching.

Therefore, with this architecture, since the signals received at the first signal input terminal In1 and the second signal input terminal In2 have no transmitted signal components, the effect of echo cancellation can be achieved.

Moreover, a gain of the amplifier circuit 1 in FIG. 3 can be further calculated as follows:

Gain=−R6*(Vin/ ((Rin/2)+RCTLE//RTX)*RTX/ (RTX+RCTLE))*(((0.5*Rv2/ (0.5*Rv2+Rv1))* (R1+1/sC1)/RCTLE)+(R1+0.5*Rv2//Rv1)/ RCTLE);

where Vin is an input voltage (a difference between +Rx and −Rx), RCTLE is the overall equivalent impedance of the CTLE 10 and the adjustable gain circuit 12, RTX is the equivalent impedance of the transmitting end device 30, R1, R6, Rv1, Rv2 represent the resistance values of the resistors R1, R6 and the variable resistors Rv1, Rv2, respectively, and s is the complex frequency σ+j ω.

Figure 4:
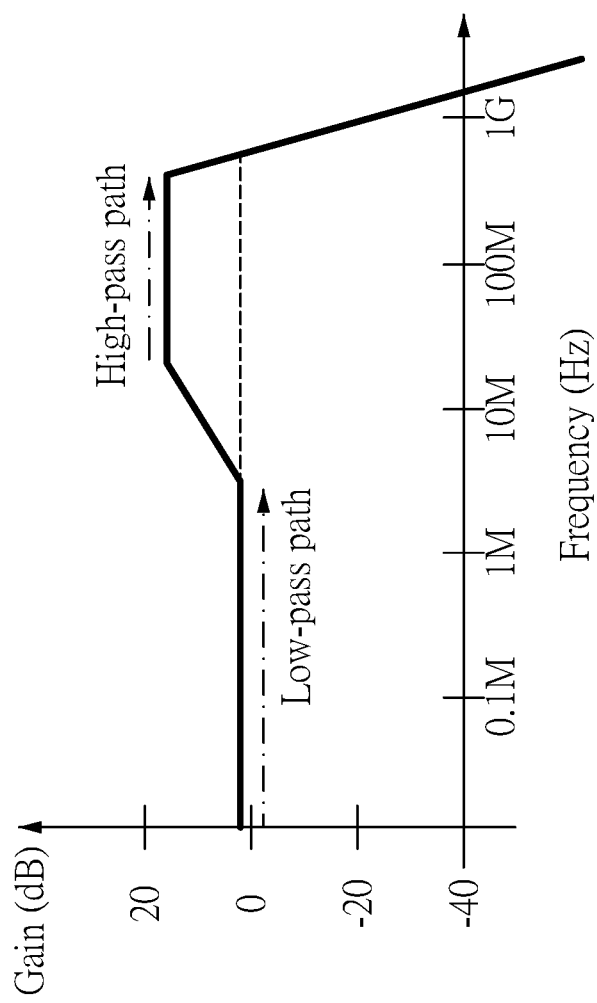
FIG. 4 is a schematic diagram of high-frequency signal amplification using the amplifier circuit provided by the present disclosure.

Reference is made to FIG. 4, which is a schematic diagram of high-frequency signal amplification using the amplifier circuit provided by the present disclosure. As shown in FIG. 4, the amplifier circuit provided by the present disclosure can be utilized to amplify high-frequency signals without increasing noise, and can therefore increase the overall signal-to-noise ratio from low to high frequencies, and greatly increase the overall connection quality and stability of the communication system.

Beneficial Effects of the Embodiments

In conclusion, the amplifier circuit provided by the present disclosure can be applied to a long-distance broadband network communication system to compensate for the attenuation of high-frequency signals, and reduce the attenuation caused by a long connection distance, while improving the connection quality of the long-distance broadband communication.

In particular, the amplifier circuit provided by the present disclosure can amplify attenuated high-frequency signals to achieve better connection quality, and only a single operational amplifier is used in the amplifier circuit to achieve functions of gain adjustment, second-order filtering, echo cancellation and high-frequency signal amplification. Furthermore, since a capacitor with a smaller area is used to amplify high-frequency signals, an area used by the circuit can be saved and the cost can be reduced.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An integrated circuit comprising:
   an equalizer circuit, including:
      a first high-pass path electrically coupled between a first signal input terminal and a first node, wherein the first high-pass path includes a first resistive circuit and a first capacitive circuit that are configured to amplify a gain of a high frequency part of a first input signal provided by a first signal source to the first signal input terminal;
      a first low-pass path electrically coupled between the first signal input terminal and a second node, wherein the first low-pass path includes a second resistive circuit;
      a second low-pass path electrically coupled between a second signal input terminal and a third node, wherein the second low-pass path includes a third resistive circuit; and
      a second high-pass path electrically coupled between the second signal input terminal and a fourth node, wherein the second high-pass path includes a fourth resistive circuit and a second capacitive circuit that are configured to amplify a gain of a high frequency part of a second input signal provided by a first signal source to the second signal input terminal;
   an adjustable gain circuit, including:
      a first variable resistive circuit electrically coupled between the second node and the third node;
      a second variable resistive circuit electrically coupled between the first node and the second node; and a third variable resistive circuit electrically coupled between the third node and the fourth node; and a filter circuit configured to amplify and filter the first signal source and the second signal source, wherein the filter circuit includes:

a fully differential operational amplifier having a first input terminal, a second input terminal, a first output terminal and a second output terminal;

a first filter network electrically coupled to the first input terminal, the first output terminal and the first node; and a second filter network electrically coupled to the second input terminal, the second output terminal and the fourth node.

2. The integrated circuit according to claim 1, wherein the equalizer circuit is a continuous time equalizer circuit.

3. The integrated circuit according to claim 2, wherein the first signal source and the second signal source are a differential pair of signal sources.

4. The integrated circuit according to claim 2, wherein the adjustable gain circuit further includes:

a first alternating current (AC) coupling capacitive circuit electrically coupled between the second variable resistive circuit and the second node; and a second AC coupling capacitive circuit electrically coupled between the third variable resistive circuit and the third node.

5. The integrated circuit according to claim 2, wherein the filter circuit is a second-order filter circuit, and the first filter network includes:

a third capacitive circuit electrically coupled between the first input terminal and the first output terminal;

a fifth resistive circuit electrically coupled between the first input terminal and the first node; and a sixth resistive circuit electrically coupled between the first output terminal and the first node;

wherein the second filter network includes:

a fourth capacitive circuit electrically coupled between the second input terminal and the second output terminal;

a seventh resistive circuit electrically coupled between the second input terminal and the fourth node; and an eighth resistive circuit electrically coupled between the second output terminal and the fourth node;

wherein the filter circuit further includes:

a fifth capacitive circuit electrically coupled between the first node and the fourth node.

6. The integrated circuit according to claim 2, further comprising an echo cancellation circuit, which includes:

a first cancellation resistive circuit electrically coupled between a fifth node and the first signal input terminal;

a second cancellation resistive circuit electrically coupled between a sixth node and the first signal input terminal;

a third cancellation resistive circuit electrically coupled between a seventh node and the second signal input terminal; and a fourth cancellation resistive circuit electrically coupled between an eighth node and the second signal input terminal.

7. The integrated circuit according to claim 6, wherein the integrated circuit is electrically coupled to a transmitting end device, a receiving end device, a voltage dividing circuit and a communication interface; wherein the transmitting end device has a first transmitting end and a second transmitting end, the communication interface includes a load, a first pad, and a second pad, and the voltage dividing circuit has a first voltage dividing resistive circuit electrically coupled to the first pad and the first transmitting end and a second voltage dividing resistive circuit electrically coupled to the second pad and the second transmitting end; wherein the eighth node is electrically coupled to a ninth node between the first pad and the first voltage dividing resistive circuit, the sixth node is electrically coupled to the first transmitting end, the seventh node is electrically coupled to the second transmitting end, and the fifth node is electrically coupled to a tenth node between the second pad and the second voltage dividing resistive circuit.

8. The integrated circuit according to claim 7, wherein the transmission end device provides a first transmission signal to the first transmission end and a second transmission signal to the second transmission end, and the communication interface provides a first receiving signal to the first pad, and provides a second receiving signal to the second pad, wherein the first transmission signal is divided by the first voltage dividing resistive circuit to superimpose the first receiving signal at the ninth node, so as to generate a first voltage dividing signal, and the second transmitting signal is divided by the second voltage dividing resistive circuit to superimpose the second receiving signal at the tenth node, so as to generate a second voltage dividing signal.

9. The integrated circuit according to claim 8, wherein resistances of the first cancellation resistive circuit and the second cancellation resistive circuit has a first proportional relationship, such that only the second receiving signal remains after the second voltage dividing voltage signal received by the fifth node and the first transmitting signal received by the sixth node are superimposed at the first signal input terminal.

10. The integrated circuit according to claim 9, wherein resistances of the third cancellation resistive circuit and the fourth cancellation resistive circuit has a second proportional relationship, such that only the first receiving signal remains after the second transmitting signal received by the seventh node and the first voltage dividing signal received by the eighth node are superimposed at the second signal input terminal.

11. The integrated circuit according to claim 10, wherein the first proportional relationship is the same as the second proportional relationship, and corresponds to a third proportional relationship between resistances of the first voltage dividing resistive circuit and the load.

* * * * *